(12) United States Patent
Lin

(10) Patent No.: US 10,178,309 B2
(45) Date of Patent: Jan. 8, 2019

(54) METHOD FOR MANUFACTURING THE SEMICONDUCTOR STRUCTURE

(71) Applicant: UNITED MICROELECTRONICS CORP., Hsinchu (TW)

(72) Inventor: Chien-Ting Lin, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/001,367

(22) Filed: Jun. 6, 2018

(65) Prior Publication Data

US 2018/0288326 A1    Oct. 4, 2018

Related U.S. Application Data

(62) Division of application No. 15/011,996, filed on Feb. 1, 2016, now Pat. No. 10,021,298.

(30) Foreign Application Priority Data

Jan. 5, 2016  (TW) .............................. 105100179 A

(51) Int. Cl.
  *H01L 29/66*  (2006.01)
  *H01L 29/49*  (2006.01)
  (Continued)

(52) U.S. Cl.
  CPC ....... *H04N 5/23238* (2013.01); *G02B 26/101* (2013.01); *H01L 21/0217* (2013.01);
  (Continued)

(58) Field of Classification Search
  CPC ......... H01L 21/02274; H01L 21/32135; H01L 21/764; H01L 29/6656; H01L 2029/7858;
  (Continued)

(56) References Cited

U.S. PATENT DOCUMENTS 6,238,987 B1 * 5/2001 Lee ..................... H01L 29/4966
                                                          257/E29.16
7,691,712 B2    4/2010 Chidambarrao et al.
(Continued)

FOREIGN PATENT DOCUMENTS

TW           201338163         9/2013

OTHER PUBLICATIONS

Taiwan Intellectual Property Office, "Office Action", dated Oct. 29, 2018.

*Primary Examiner* — William F Kraig
*Assistant Examiner* — Khatib Rahman
(74) *Attorney, Agent, or Firm* — WPAT, PC

(57) ABSTRACT

A semiconductor structure and a method for manufacturing the same are provided. The semiconductor structure comprises a substrate, a gate structure, a first dielectric layer and two air gaps. The gate structure is disposed on the substrate. The gate structure has two opposite side walls. The gate structure comprises a U-shaped structure and a metal gate electrode. The U-shaped structure defines an opening toward upside, and comprises a work function layer. The metal gate electrode is disposed in the opening defined by the U-shaped structure. A level of a top surface of the U-shaped structure is lower than a level of a top surface of the metal gate electrode. The first dielectric layer is disposed on the substrate adjacent to the gate structure. Each of the two air gaps is formed between the first dielectric layer and one of the two opposite side walls of the gate structure.

10 Claims, 6 Drawing Sheets

(51) Int. Cl.
*H04N 5/232* (2006.01)
*H04N 5/225* (2006.01)
*H01L 29/06* (2006.01)
*H01L 21/02* (2006.01)
*H01L 21/283* (2006.01)
*H01L 21/3213* (2006.01)
*H01L 21/764* (2006.01)
*H01L 29/78* (2006.01)
*H01L 29/423* (2006.01)
*G02B 26/10* (2006.01)

(52) U.S. Cl.
CPC ...... *H01L 21/02274* (2013.01); *H01L 21/283* (2013.01); *H01L 21/32135* (2013.01); *H01L 21/764* (2013.01); *H01L 29/0649* (2013.01); *H01L 29/42356* (2013.01); *H01L 29/4991* (2013.01); *H01L 29/6656* (2013.01); *H01L 29/66545* (2013.01); *H01L 29/66795* (2013.01); *H01L 29/785* (2013.01); *H04N 5/2254* (2013.01); *H04N 5/2259* (2013.01); *H04N 5/23254* (2013.01); *H04N 5/23258* (2013.01); *H04N 5/23287* (2013.01)

(58) Field of Classification Search
CPC ....... H01L 21/82345; H01L 21/823842; H01L 29/66484; H01L 29/4958; H01L 29/7831–29/7832; H01L 29/4236; H01L 29/42352; H01L 29/66613–29/66628; H01L 21/28132; H01L 21/28141; H01L 21/2815; H01L 21/823468; H01L 21/823864; H01L 29/66553; H01L 29/66689; H01L 29/66719; H01L 29/0649; H01L 29/785; H01L 29/42356; H01L 29/66545; H01L 29/4991
See application file for complete search history.

(56) References Cited

U.S. PATENT DOCUMENTS

| | | | |
|---|---|---|---|
| 8,361,854 B2 | 1/2013 | Tsai et al. | |
| 8,421,166 B2* | 4/2013 | Chi | H01L 29/665 257/202 |
| 2013/0093019 A1 | 4/2013 | Ando et al. | |
| 2013/0313648 A1 | 11/2013 | Chiang et al. | |
| 2015/0214220 A1* | 7/2015 | Seo | H01L 27/088 257/392 |
| 2016/0071944 A1* | 3/2016 | Lu | H01L 29/42376 257/392 |

* cited by examiner

METHOD FOR MANUFACTURING THE SEMICONDUCTOR STRUCTURE

The application is a divisional application of U.S. patent application Ser. No. 15/011,996, filed on Feb. 1, 2016, which claims the benefit of Taiwan application Serial No. 105100179, filed Jan. 5, 2016, the subject matter of which is incorporated herein by reference.

TECHNICAL FIELD

The disclosure relates to a method for manufacturing a semiconductor structure. More particularly, the disclosure relates to a method for manufacturing a semiconductor structure comprising a metal gate structure.

BACKGROUND

In a semiconductor structure, any conductor-dielectric-conductor structure may exhibit a capacitance. An undesired capacitance, such as the capacitance formed between the gate structure and the source/drain region, the capacitance formed between the gate structure and a slot contact, or the like, may disadvantageously affect the operation of a semiconductor device. The problem becomes more critical as the semiconductor structures become smaller.

SUMMARY

This disclosure is directed to an approach to reduce an undesired capacitance.

According to some embodiments, a semiconductor structure is provided. The semiconductor structure comprises a substrate, a gate structure, a first dielectric layer and two air gaps. The gate structure is disposed on the substrate. The gate structure has two opposite side walls. The gate structure comprises a U-shaped structure and a metal gate electrode. The U-shaped structure defines an opening toward upside. The U-shaped structure comprises a work function layer. The metal gate electrode is disposed in the opening defined by the U-shaped structure. A level of a top surface of the U-shaped structure is lower than a level of a top surface of the metal gate electrode. The first dielectric layer is disposed on the substrate and adjacent to the gate structure. Each of the two air gaps is formed between the first dielectric layer and one of the two opposite side walls of the gate structure.

According to some embodiments, a method for manufacturing a semiconductor structure is provided. The method comprises the following steps. First, a substrate is provided. A sacrificial gate structure is formed on the substrate. The sacrificial gate structure has two opposite side walls. Two sacrificial spacers are formed on the two opposite side walls of the sacrificial gate structure, respectively. A first dielectric layer is formed on the substrate and adjacent to the sacrificial gate structure. Then, the sacrificial gate structure is removed and an opening is formed. A gate structure is formed in the opening. The gate structure has two opposite side walls. The gate structure comprises a U-shaped structure and a metal gate electrode. The U-shaped structure defines an opening toward upside. The U-shaped structure comprises a work function layer. The metal gate electrode is formed in the opening defined by the U-shaped structure. A level of a top surface of the U-shape structure is lower than a level of a top surface of the metal gate electrode. Thereafter, the sacrificial spacers are removed, and two air gaps are formed between the first dielectric layer and the two opposite side walls of the gate structure.

Figure 1:
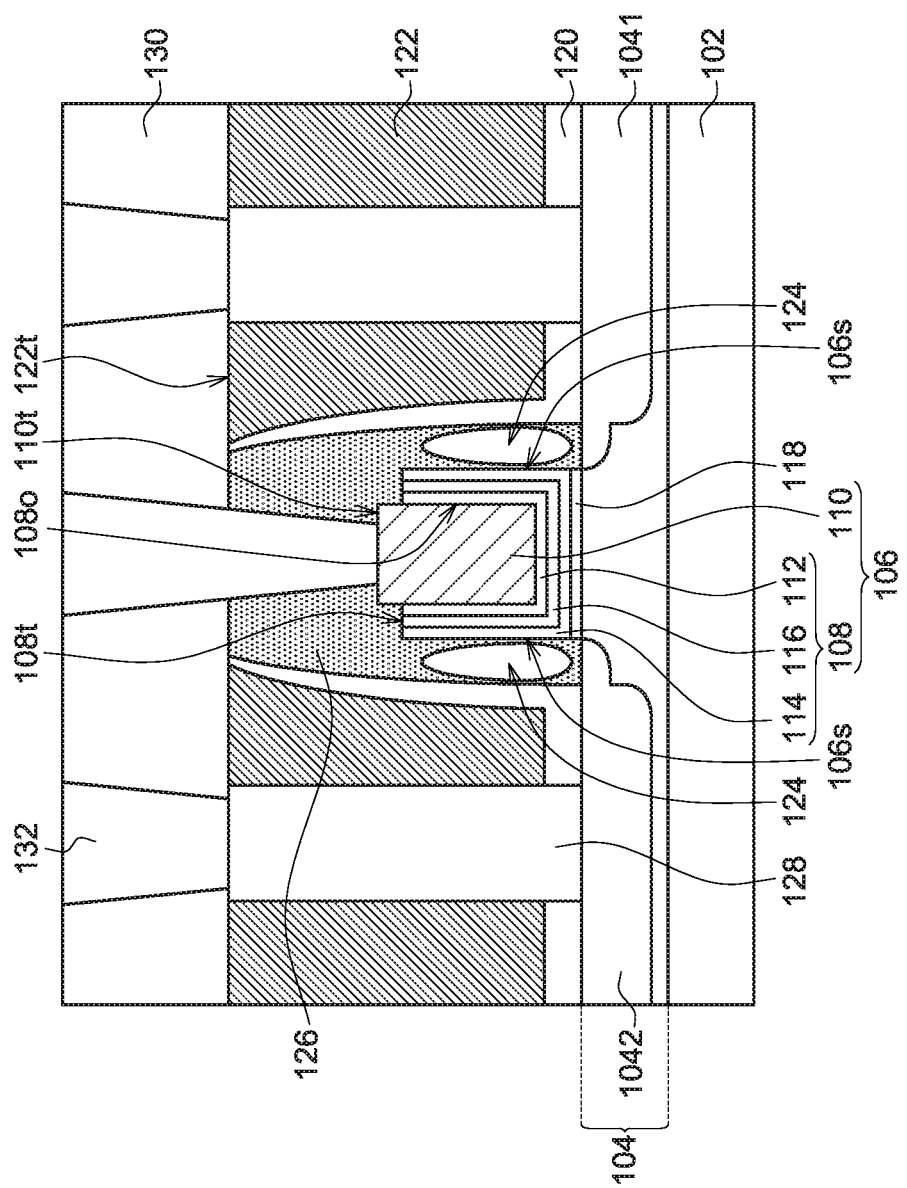
FIG. 1 illustrates a semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. For clarity, the elements in the figures may not reflect their real sizes. Further, some components may be omitted. It is contemplated that elements and features of one embodiment may be beneficially incorporated in another embodiment without further recitation.

Referring to FIG. 1, a semiconductor structure according to embodiments is provided. The semiconductor structure comprises a substrate 102, a gate structure 106, a first dielectric layer 122 and two air gaps 124. The gate structure 106 is disposed on the substrate 102. The gate structure 106 has two opposite side walls 106s. The first dielectric layer 122 is disposed on the substrate 102 and adjacent to the gate structure 106. Each of the two air gaps 124 is formed between the first dielectric layer 122 and one of the two opposite side walls 106s of the gate structure 106.

Further details of the semiconductor structure are provided hereinafter. In some embodiments, the gate structure 106 is directly disposed on the substrate 102. Alternatively, as shown in FIG. 1, the semiconductor structure may further comprise a fin 104. The fin 104 may be a part of the SOI (silicon on insulator) or silicon substrate 102, as shown in FIG. 1, or may be formed by an epitaxial process on the substrate 102 made of any material. The gate structure 106 is disposed on and across the fin 104. More specifically, the fin 104 may extend along a first direction, and the gate structure 106 may extend along a second direction different from the first direction. In FIG. 1, the first direction is the horizontal direction on the paper, and the second direction is the direction perpendicular to the paper. The fin 104 may comprise two source/drain regions 1041 and 1042 therein. The two source/drain regions 1041 and 1042 are disposed at two sides of the gate structure 106, respectively.

According to some embodiments, the semiconductor structure may further comprise an interfacial dielectric layer 118. The interfacial dielectric layer 118 is disposed on the substrate 102, and the gate structure 106 is disposed on the interfacial dielectric layer 118. As such, a potential interfacial problem between the substrate 102 and the gate structure 106 can be mitigated.

The gate structure 106 may be a metal gate structure. In such cases, the gate structure 106 comprises a U-shaped structure 108 and a metal gate electrode 110. The U-shaped structure 108 defines an opening 108o toward upside. The U-shaped structure 108 comprises a work function layer 112. According to some embodiments, the U-shaped structure 108 may further comprise a high-k dielectric layer 114, wherein the work function layer 112 is disposed on the high-k dielectric layer 114. According to some embodiments, the U-shaped structure 108 may optionally further comprise an etch stop layer 116, wherein the etch stop layer 116 is disposed between the work function layer 112 and the high-k dielectric layer 114. According to some embodiments, the U-shaped structure 108 may further comprise a barrier layer (not shown in FIG. 1), wherein the barrier layer is disposed on the work function layer 112. These layers together constitute the U-shaped structure 108. The metal gate electrode 110 is disposed in the opening 108o defined by the U-shaped structure 108. A level of a top surface 108t of the U-shaped structure 108 is lower than a level of a top surface 110t of the metal gate electrode 110. Further, in some embodiments, as shown in FIG. 1, the air gaps 124 do not extend above the level of the top surface 108t of the U-shaped structure 108. In some embodiments, as shown in FIG. 1, the level of the top surface 108t of the U-shaped structure 108 and the level of the top surface 110t of the metal gate electrode 110 are lower than a level of a top surface 122t of the first dielectric layer 122.

The semiconductor structure may further comprise a contact etch stop layer 120. The contact etch stop layer 120 is disposed on the substrate 102 (or on the fin 104 in some cases) and at two sides of the gate structure 106, and the first dielectric layer 122 is disposed on the contact etch stop layer 120.

The semiconductor structure may further comprise a second dielectric layer 126. The second dielectric layer 126 seals the air gaps 124. According to some embodiments, the second dielectric layer 126 may be formed of silicon oxide or silicon nitride such as by plasma-enhanced chemical vapor deposition (PECVD).

The semiconductor structure may further comprise other typical components in a semiconductor device. For example, as shown in FIG. 1, the semiconductor structure may further comprise contacts 128 such as slot contacts, a third dielectric layer 130 and contacts 132. The contacts 128 are disposed through the first dielectric layer 122 at two sides of the gate structure 106. The third dielectric layer 130 is disposed on the first dielectric layer 122. The contacts 132 are disposed through the third dielectric layer 130, and connected to the slot contacts 128 and the gate structure 106.

In the semiconductor structure according to embodiments described above, spacers typically disposed on the side walls of a gate structure are replaced by air gaps. Since the dielectric constant of the air gaps is lower than the dielectric constant of the spacers, the capacitances, particularly the capacitance formed between the gate structure and the source/drain region, the capacitance formed between the gate structure and the slot contact, or the like, can be reduced. As such, the device performance can be improved.

Figure 2A:
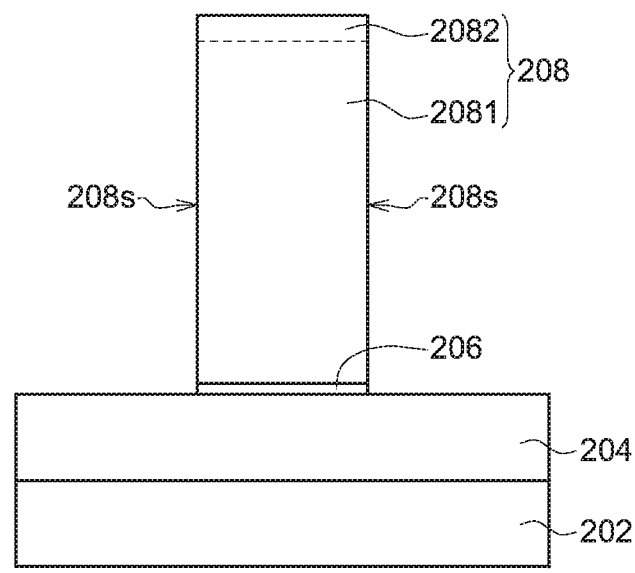
FIGS. 2A-2I illustrate a semiconductor structure at various stages of manufacturing according to embodiments.

Now a method for manufacturing a semiconductor structure according to embodiments is provided. Referring to FIG. 2A, a substrate 202 is provided at first. The substrate 202 may be a silicon substrate, a silicon-containing substrate, a silicon-on-insulator (SOI) substrate, or the like. According to some embodiments, a fin 204 may be formed on the substrate 202, as shown in FIG. 2A. The fin 204 may be formed of silicon. According to some embodiments, an interfacial dielectric layer 206 may be formed on the substrate 202, such as on the fin 204, as shown in FIG. 2A. The interfacial dielectric layer 206 may be formed of silicon dioxide. A sacrificial gate structure 208 is formed on the substrate 202, such as on the fin 204 and the interfacial dielectric layer 206. The sacrificial gate structure 208 is across the fin 204. The sacrificial gate structure 208 has two opposite side walls 208s. In some embodiments, the sacrificial gate structure 208 comprises a silicon layer 2081 and an optional hard mask layer 2082, but the embodiments are not limited thereto.

Figure 2B:
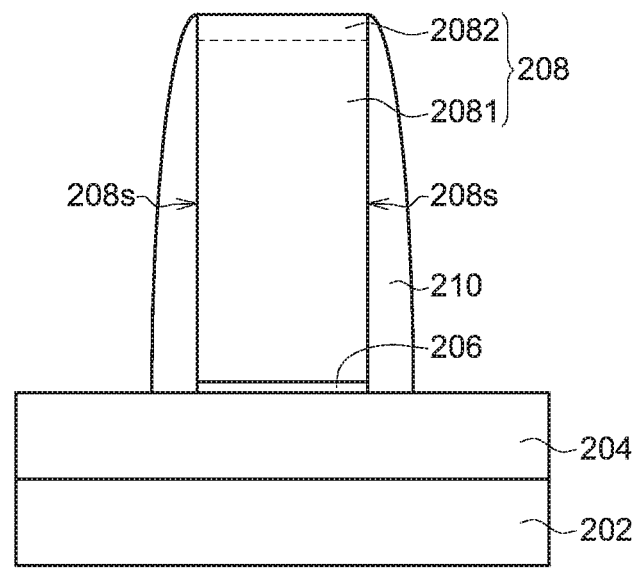

Referring to FIG. 2B, two sacrificial spacers 210 are formed on the two opposite side walls 208s of the sacrificial gate structure 208, respectively. The sacrificial spacers 210 may be formed of silicon nitride, SiOCN, or the like. While not shown in the figures, in some embodiments, source/drain regions are formed in the fin 204 by a self-align implantation process using the sacrificial gate structure 208 and the sacrificial spacers 210 as masks.

Figure 2C:
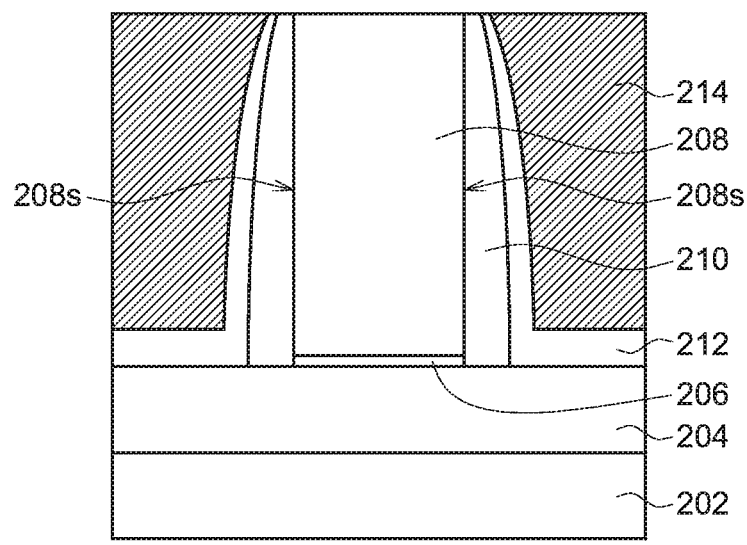

Referring to FIG. 2C, a contact etch stop layer may be optionally formed on the substrate 202 and covering the sacrificial gate structure 208. Then, a first dielectric layer is formed on the contact etch stop layer. The first dielectric layer is preferably formed of a material different from the material of the contact etch stop layer. Then, a planarization process, such as a chemical mechanical planarization (CMP) process, may be conducted until the hard mask layer 2082 is removed and the silicon layer 2081 is exposed. As such, the contact etch stop layer 212 and the first dielectric layer 214 formed on the substrate 202 and adjacent to the sacrificial gate structure 208 are formed.

Figure 2D:
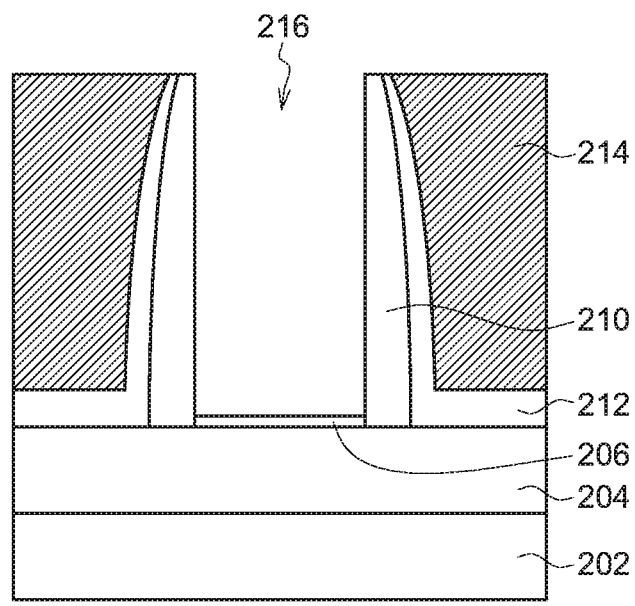

Thereafter, the sacrificial gate structure 208 is removed and an opening 216 is formed, as shown in FIG. 2D. In the following steps, a gate structure 226 will be formed in the opening 216.

Figure 2E:
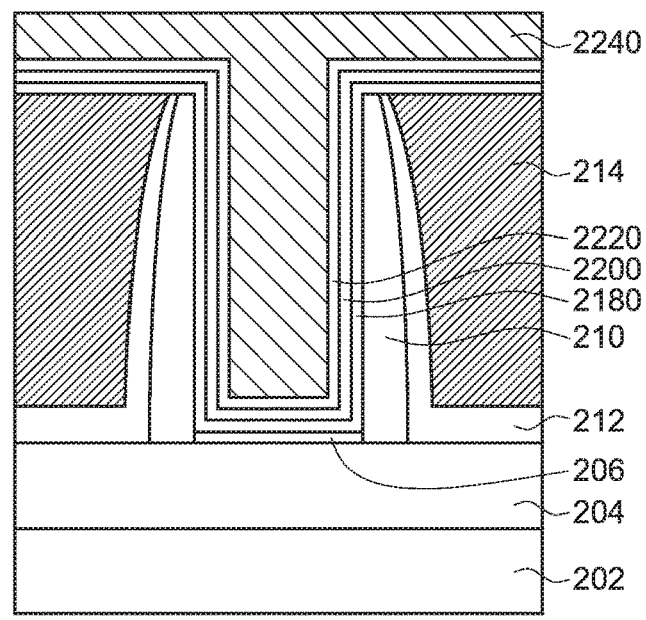

Referring to FIG. 2E, a layer 2180 comprising a high-k dielectric material, a layer 2200 comprising an etch stop material and a layer 2220 comprising a work function material are sequentially formed on the first dielectric layer 214 and in the opening 216 in a conformal manner, wherein the layer 2180 and the layer 2200 are optional. Then, a material 2240 comprising low-resistivity metallic material(s) is formed on the layer 2220 and filled into the opening 216. The high-k dielectric material may be $HfO_2$, $HfSiO_4$, HfSiON, $Al_2O_3$, $La_2O_3$, $Ta_2O_5$, $Y_2O_3$, $ZrO_2$, $SrTiO_3$, $ZrSiO_4$, $HfZrO_4$, SBT($SrBi_2Ta_2O_9$), PZT ($PbZr_xTi_{1-x}O_3$), BST ($Ba_xSr_{1-x}TiO_3$), or the like. The etch stop material may be TaN or the like. The work function material may be TiN or the like (for p-type semiconductor device), or may be TiAO, TiAlN, or the like (for n-type semiconductor device). The low-resistivity metallic material(s) may be tungsten, aluminum, copper, or the like.

Figure 2F:
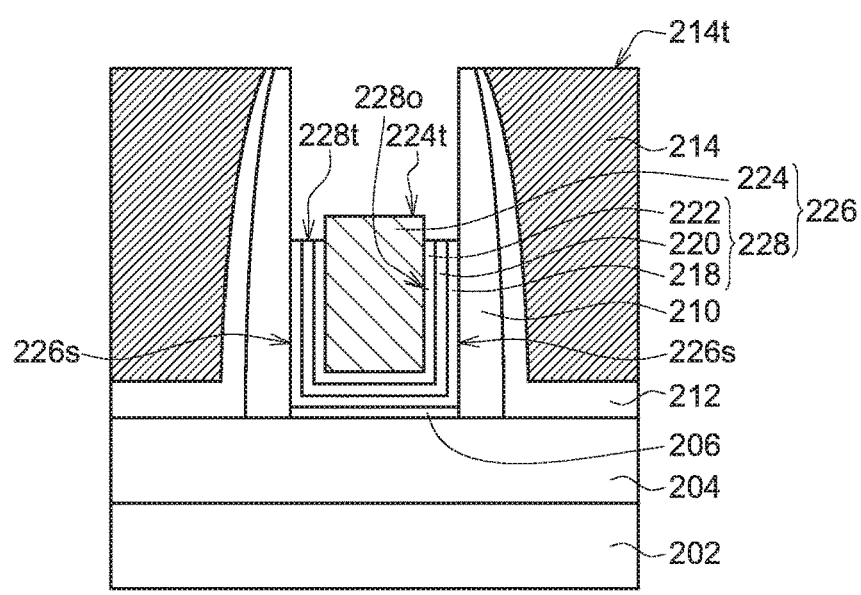
Figure 2G:
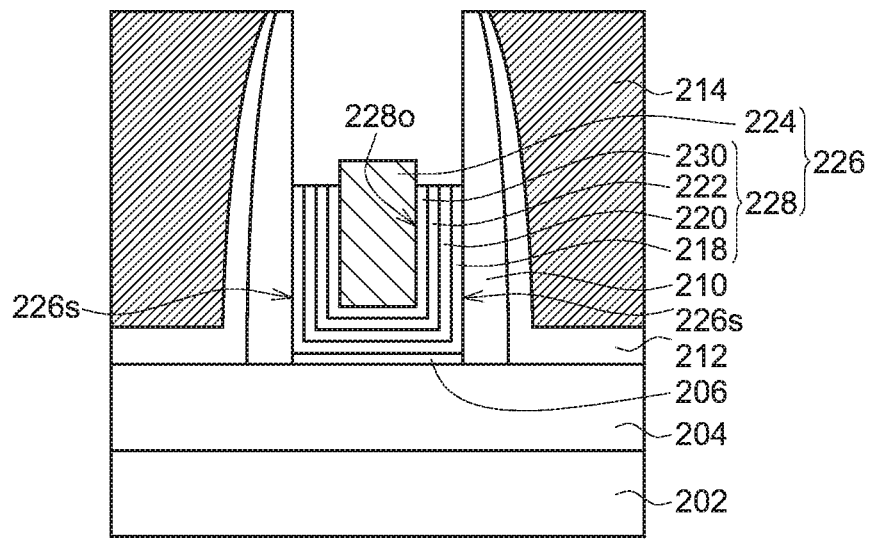

Referring to FIG. 2F, a removing process is conducted to form the gate structure 226 in the opening 216. The gate structure 226 has two opposite side walls 226s. The gate structure 226 comprises a U-shaped structure 228 and a metal gate electrode 224. The U-shaped structure 228 defines an opening 228o toward upside. The U-shaped structure 228 comprises at least the work function layer 222. According to some embodiments, the U-shaped structure 228 may further comprise the high-k dielectric layer 218, wherein the work function layer 222 is formed on the high-k dielectric layer 218. According to some embodiments, the U-shaped structure 228 may further comprise the etch stop layer 220, wherein the etch stop layer 220 is formed between the work function layer 222 and the high-k dielectric layer 218. According to some embodiments, as shown in FIG. 2G (an alternative of FIG. 2F), the U-shaped structure 228 may further comprise a barrier layer 230, wherein the barrier layer 230 is formed on the work function layer 222. The barrier layer 230 may be formed of TiN or the like. The metal gate electrode 224 is formed in the opening 228o defined by the U-shaped structure 228. A level of a top surface 228t of the U-shaped structure 228 is lower than a level of a top surface 224t of the metal gate electrode 224. It is advantageous for further reducing the undesired capacitance.

For example, a planarization process, such as a CMP process, may be conducted until the first dielectric layer 214 is exposed again. In some embodiments, a dry etch process and a wet etch process may be further conducted to remove portions of materials of the U-shaped structure 228 and the metal gate electrode 224 such that the level of the top surface 228t of the U-shaped structure 228 and the level of the top surface 224t of the metal gate electrode 224 are lower than a level of a top surface 214t of the first dielectric layer 214. It is advantageous for further reducing the undesired capacitance.

Figure 2H:
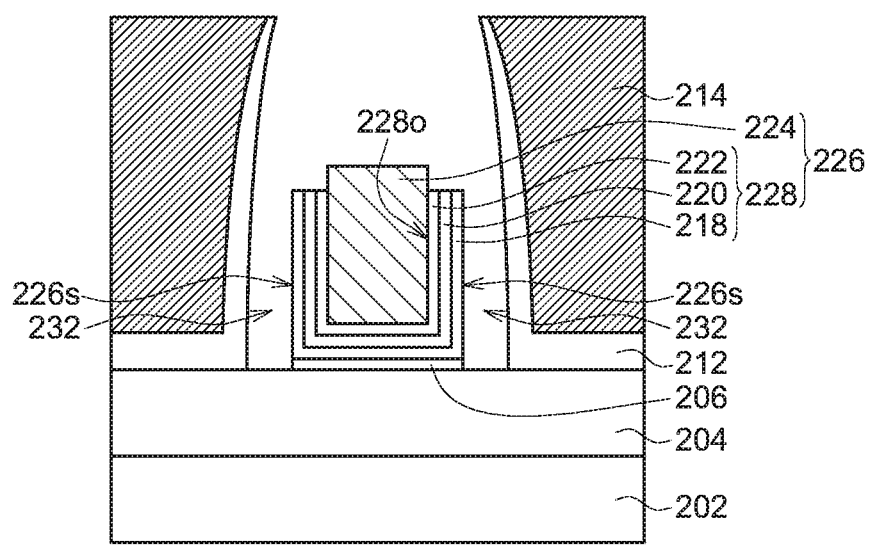

Referring to FIG. 2H, the sacrificial spacers 210 are removed, and two air gaps 232 are formed between the first dielectric layer 214 and the two opposite side walls 226s of the gate structure 226. The removal of the sacrificial spacers 210 may be conducted by a dry etch process and a wet etch process. By removing the sacrificial spacers 210 and forming the air gaps 232, undesired capacitances in the semiconductor structure can be reduced. As such, the device performance can be improved.

Figure 2I:
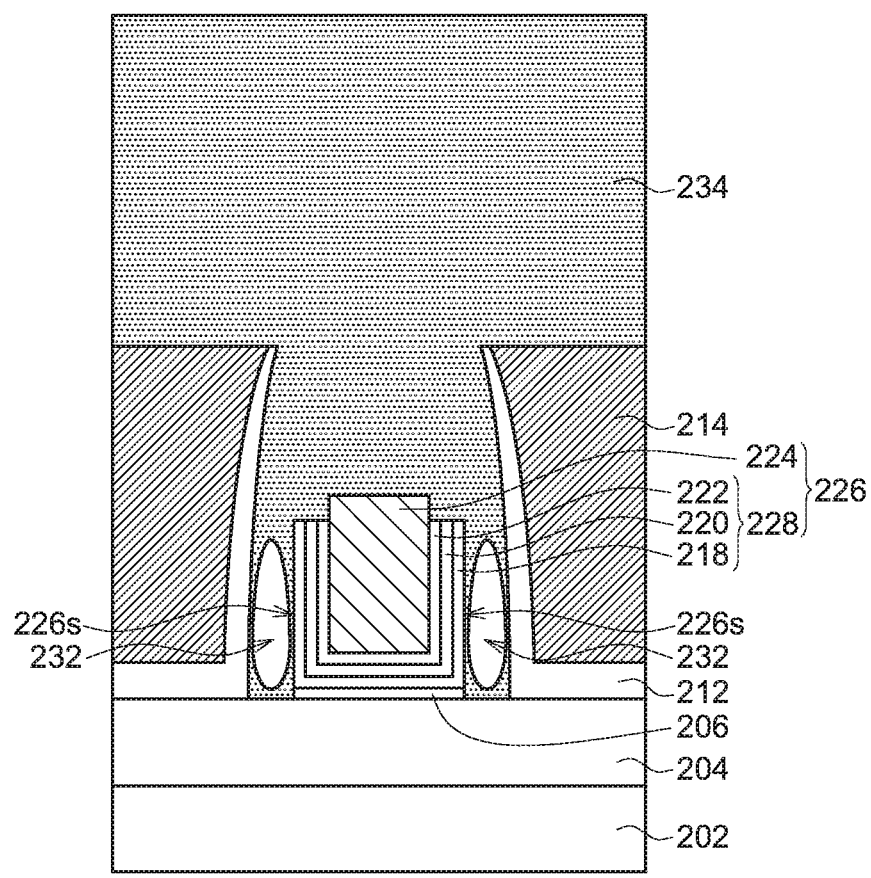

Referring to FIG. 2I, a second dielectric layer 234 may be further formed on the first dielectric layer 214 such that the second dielectric layer 234 seals the air gaps 232. The second dielectric layer 234 may be formed of silicon oxide or silicon nitride by PECVD. In some embodiments, as shown in FIG. 2I, the material of the second dielectric layer 234 may be filled into the air gaps 232, and thus the air gaps 232 shrink and become drop-like. The material of the second dielectric layer 234 formed on sidewalls of the original air gaps 232 may be several angstroms, and the material of the second dielectric layer 234 formed on bottoms of the original air gaps 232 may be several tens of angstroms. As such, the air gaps 232 do not extend above the level of the top surface 228t of the U-shaped structure 228. Thereafter, a removing process, such as a CMP process, may be conducted to remove the unneeded portion of the second dielectric layer 234. However, the remaining portion of the second dielectric layer 234 should be enough to seal the air gaps 232.

Thereafter, other typical steps for the manufacturing of a semiconductor device, such as the steps for forming the slot contacts, the third dielectric layer and contacts as shown in FIG. 1, may be further conducted.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for manufacturing a semiconductor structure, comprising:
    providing a substrate;
    forming a sacrificial gate structure on the substrate, the sacrificial gate structure having two opposite side walls;
    forming two sacrificial spacers on the two opposite side walls of the sacrificial gate structure, respectively;
    forming a first dielectric layer on the substrate and adjacent to the sacrificial gate structure;
    removing the sacrificial gate structure and forming an opening;
    forming a gate structure in the opening, the gate structure having two opposite side walls, the gate structure comprising:
        a U-shaped structure defining an opening toward upside, the U-shaped structure comprising a work function layer; and
        a metal gate electrode formed in the opening defined by the U-shaped structure, wherein a level of a top surface of the U-shaped structure is lower than a level of a top surface of the metal gate electrode; and
    removing the sacrificial spacers and forming two air gaps between the first dielectric layer and the two opposite side walls of the gate structure,
    wherein each of the air gaps and the U-shaped structure are non-overlapping in a normal direction of a top surface of the substrate.

2. The method according to claim 1, wherein the air gaps do not extend above the level of the top surface of the U-shaped structure.

3. The method according to claim 1, wherein forming the gate structure comprises removing portions of materials of the U-shaped structure and the metal gate electrode such that the level of the top surface of the U-shaped structure and the level of the top surface of the metal gate electrode are lower than a level of a top surface of the first dielectric layer.

4. The method according to claim 1, further comprising:
    forming a second dielectric layer on the first dielectric layer such that the second dielectric layer seals the air gaps.

5. The method according to claim 4, wherein the second dielectric layer is formed of silicon nitride by PECVD.

6. The method according to claim 1, further comprising:
    forming an interfacial dielectric layer on the substrate, wherein the sacrificial gate structure is formed on the interfacial dielectric layer.

7. The method according to claim 1, wherein the U-shaped structure further comprises a high-k dielectric layer, wherein the work function layer is formed on the high-k dielectric layer.

8. The method according to claim 7, wherein the U-shaped structure further comprises an etch stop layer, wherein the etch stop layer is formed between the work function layer and the high-k dielectric layer.

9. The method according to claim 8, wherein the U-shaped structure further comprises a barrier layer, wherein the barrier layer is formed on the work function layer.

10. The method according to claim 1, further comprising:
    forming a fin on the substrate, wherein the sacrificial gate structure is formed on and across the fin.

* * * * *